United States Patent
Kobayashi et al.

(10) Patent No.: US 10,175,326 B2
(45) Date of Patent: Jan. 8, 2019

(54) SYSTEMS AND METHODS FOR GRADIENT-MODULATED POINTWISE ENCODING TIME REDUCTION WITH RADIAL ACQUISITION MAGNETIC RESONANCE IMAGING

(71) Applicants: Naoharu Kobayashi, Minneapolis, MN (US); Michael Garwood, Minneapolis, MN (US)

(72) Inventors: Naoharu Kobayashi, Minneapolis, MN (US); Michael Garwood, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 184 days.

(21) Appl. No.: 15/153,930

(22) Filed: May 13, 2016

(65) Prior Publication Data

US 2016/0334483 A1 Nov. 17, 2016

Related U.S. Application Data

(60) Provisional application No. 62/161,609, filed on May 14, 2015.

(51) Int. Cl.
| | |
|---|---|
| G01R 33/563 | (2006.01) |
| G01N 24/00 | (2006.01) |
| G01R 33/561 | (2006.01) |
| G01R 33/48 | (2006.01) |

(52) U.S. Cl.
CPC ....... *G01R 33/561* (2013.01); *G01R 33/4818* (2013.01); *G01R 33/4816* (2013.01); *G01R 33/4824* (2013.01)

(58) Field of Classification Search
CPC .............. G01R 33/561; G01R 33/4818; G01R 33/4824; G01R 33/4816
USPC .................................. 324/306, 309; 600/410
See application file for complete search history.

(56) References Cited

U.S. PATENT DOCUMENTS

2011/0288398 A1* 11/2011 Park ................... G01R 33/4641
600/410

* cited by examiner

*Primary Examiner* — Farhana Hoque
(74) *Attorney, Agent, or Firm* — Quarles & Brady LLP

(57) ABSTRACT

Systems and methods for pointwise encoding time reduction with radial acquisition ("PETRA") magnetic resonance imaging ("MRI") using a gradient modulation scheme to enable higher readout bandwidth while keeping the missing samples of the central region of k-space small are provided. This acquisition scheme allows independent selection of the excitation and readout bandwidths, which allows a higher readout bandwidth while keeping the required number of missing central k-space samples low. This flexibility in selecting the excitation and readout bandwidth settings can mitigate the peak radio frequency power and specific absorption rate limitations on flip angle in traditional PETRA imaging schemes.

20 Claims, 3 Drawing Sheets

SYSTEMS AND METHODS FOR GRADIENT-MODULATED POINTWISE ENCODING TIME REDUCTION WITH RADIAL ACQUISITION MAGNETIC RESONANCE IMAGING

CROSS-REFERENCE TO RELATED APPLICATIONS

This application claims the benefit of U.S. Provisional Patent Application Ser. No. 62/161,609, filed on May 14, 2015, and entitled "SYSTEMS AND METHODS FOR GRADIENT-MODULATED POINTWISE ENCODING TIME REDUCTION WITH RADIAL ACQUISITION MAGNETIC RESONANCE IMAGING."

STATEMENT REGARDING FEDERALLY SPONSORED RESEARCH

This invention was made with government support under EB015894 and RR026783 awarded by National Institutes of Health. The government has certain rights in the invention.

BACKGROUND OF THE INVENTION

Off-resonance blurring is a common problem for radial ultra-short echo time sequences such as zero echo time ("ZTE") and sweep imaging with Fourier transform ("SWIFT"). One efficient and simple solution to address this off-resonance blurring is to use higher readout bandwidth. However, these pulse sequences need fast switching of transmit and receive (T/R) mode to achieve higher bandwidth, which confronts a severe limitation in clinical MRI scanners.

Pointwise Encoding Time reduction with Radial Acquisition ("PETRA") overcomes the T/R switching limitation by combining ZTE with a single point imaging ("SPI") acquisition. In ZTE, slow T/R switching results in missing k-space center points. Thus, PETRA acquires the missing k-space center points with additional SPI acquisitions.

However, while PETRA alleviates the requirement on fast T/R switching, the use of higher bandwidth increases the number of missing k-space center points. In general, the number of missing k-space center points is proportional to the cube of the readout bandwidth. Therefore, higher bandwidth with slow T/R switching results in long additional SPI acquisition times. Another drawback of using higher bandwidth in PETRA is an increase of radiofrequency ("RF") pulse peak power and specific absorption rate ("SAR") because the higher readout bandwidth results in an increase of excitation bandwidth. The increase in RF pulse peak power and SAR with higher bandwidth limits the available flip angles that can be safely used in PETRA.

Thus, there remains a need for an ultra-short echo time pulse sequence that overcomes the off-resonance blurring issues of ZTE and SWIFT, without the limitations that PETRA has on receiver bandwidth, scan duration, and available flip angles.

SUMMARY OF THE INVENTION

The present invention overcomes the aforementioned drawbacks by providing a method for producing an image with a magnetic resonance imaging ("MRI") system. A radio frequency ("RF") excitation pulse is applied to a subject by the MRI system, and first and second data are acquired from the subject using the MRI system. The first data are acquired by sampling a central region of k-space during a first time period occurring after the RF excitation pulse. A constant magnetic field gradient is applied to the subject during this first time period while the first data are acquired. In some examples, the first data are acquired using a single point imaging ("SPI") acquisition. Second data are then acquired from the subject using the MRI system. The second data are acquired by sampling an outer region of k-space during a second time period that occurs after the RF excitation pulse. An amplitude-modulated magnetic field gradient is applied to the subject during the second time period while the second data are acquired. In some examples, the second data are acquired using a radial acquisition. An image of the subject is then reconstructed from the first data and the second data.

In some examples, the excitation bandwidth and the readout bandwidth can be independently controlled, such that the excitation bandwidth can be lower than the readout bandwidth.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for pointwise encoding time reduction with radial acquisition ("PETRA") magnetic resonance imaging ("MRI") using a gradient modulation scheme to enable higher readout bandwidth while keeping the missing samples of the central region of k-space small. This acquisition scheme reduces the scan duration by keeping the number of missing central k-space samples low, thereby requiring a shorter single point imaging ("SPI") acquisition to acquire data from this central region of k-space.

The acquisition scheme described here also has the advantage of the excitation and readout bandwidth settings being independent of one another. In general, PETRA and ZTE sequences with a higher bandwidth have significant limitations on the available flip angles due to high RF peak power and specific absorption rate ("SAR"). The flexibility of the excitation and readout bandwidth settings achievable with the gradient-modulated acquisition scheme described here can significantly mitigate the flip angle limitation of previous PETRA and ZTE methods.

Figure 1:
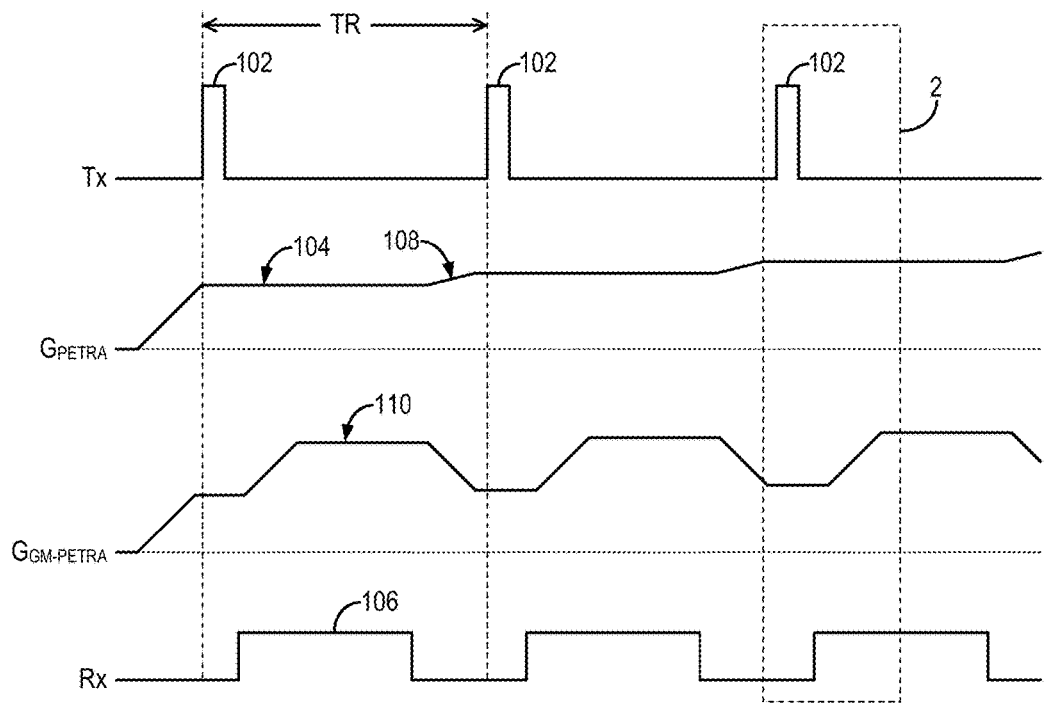
FIG. 1 illustrates the differences between a conventional PETRA pulse sequence with a constant gradient and a gradient-modulated PETRA pulse sequence with an amplitude-modulated gradient.
Figure 2:
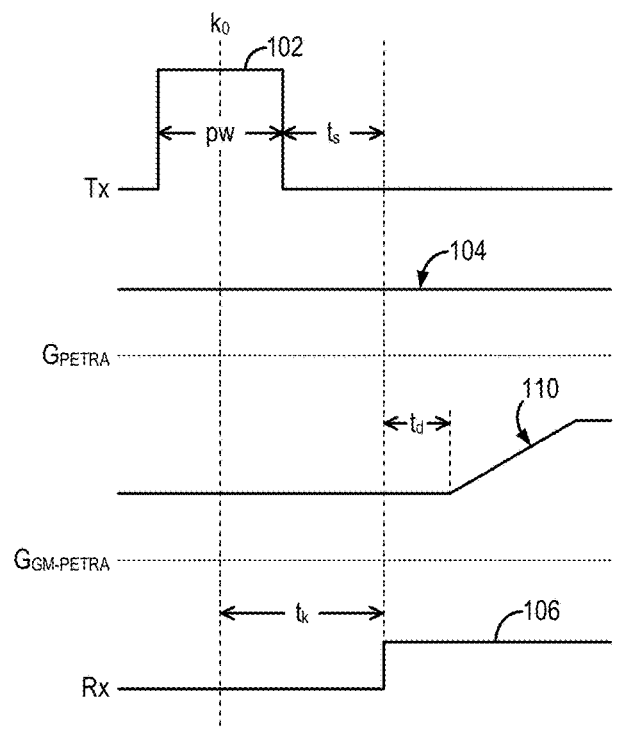
FIG. 2 illustrates an enlarged portion of the pulse sequences of FIG. 1, in which the T/R switching period of the two pulse sequences is shown.

FIGS. 1 and 2 show examples of pulse sequences used to implement conventional PETRA techniques and the gradient modulated PETRA techniques described here. The portion of the pulse sequence of FIG. 1 contained in the dashed box 20 is shown enlarged in FIG. 2.

In conventional PETRA imaging techniques, signal acquisition starts immediately after a hard pulse excitation 102 and the following transmit/receive ("T/R") switching delay, $t_s$, while constant magnetic field gradients 104 are applied. Data acquisition occurs in an acquisition window 106 during which the magnetic field gradients 104 are constant. After the data acquisition, the magnetic field gradients 104 are stepped to a different amplitude during a ramp period 108; however, no data acquisition occurs during this ramp period.

In the gradient-modulated ("GM") PETRA method described here, an amplitude-modulated gradient 110 is applied during the data acquisition window 106. After the receiver gate is turned on to initiate an acquisition window 106, the gradient amplitude begins increasing from a first value, $G_1$, to a second value $G_2$, following a short delay time, $t_d$. As one example, the first value may be the amplitude of a constant gradient, $G_{ex}$, implemented in conventional PETRA acquisitions, and the second value can be the maximum gradient amplitude, $G_{max}$, achievable with the particular MRI system.

Under the same excitation bandwidth conditions, conventional PETRA and GM-PETRA are identical until the gradient amplitude is modulated during data acquisition in GM-PETRA. As an example, by increasing the gradient amplitude (and readout bandwidth) in GM-PETRA, k-space is sampled more quickly. Moreover, lower bandwidth in excitation than readout in GM-PETRA reduces the amount of peak RF power and SAR. For conventional pulses, such as the hard pulses described above, RF peak power, $B_{1,max}$, and SAR have the following relationship with respect to flip angle, $\alpha$, and excitation bandwidth, $BW_{ex}$:

$$B_{1,max} \propto \alpha \cdot BW_{ex} \qquad (1);$$

$$SAR \propto \alpha^2 \cdot BW_{ex} \qquad (2).$$

Therefore, lower excitation bandwidth, $BW_{ex}$, reduces SAR and RF peak power. Another advantage of using lower excitation bandwidth is the reduction of missing points around the central region of k-space, since the number of missing points in each radial acquisition is given by $t_k \cdot BW_{ex}$.

Figure 3:
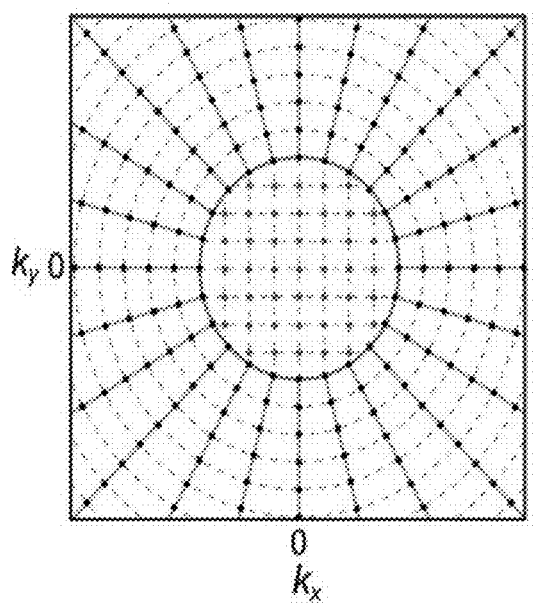
FIG. 3 is an example k-space sampling pattern implemented with a PETRA acquisition.
Figure 4:
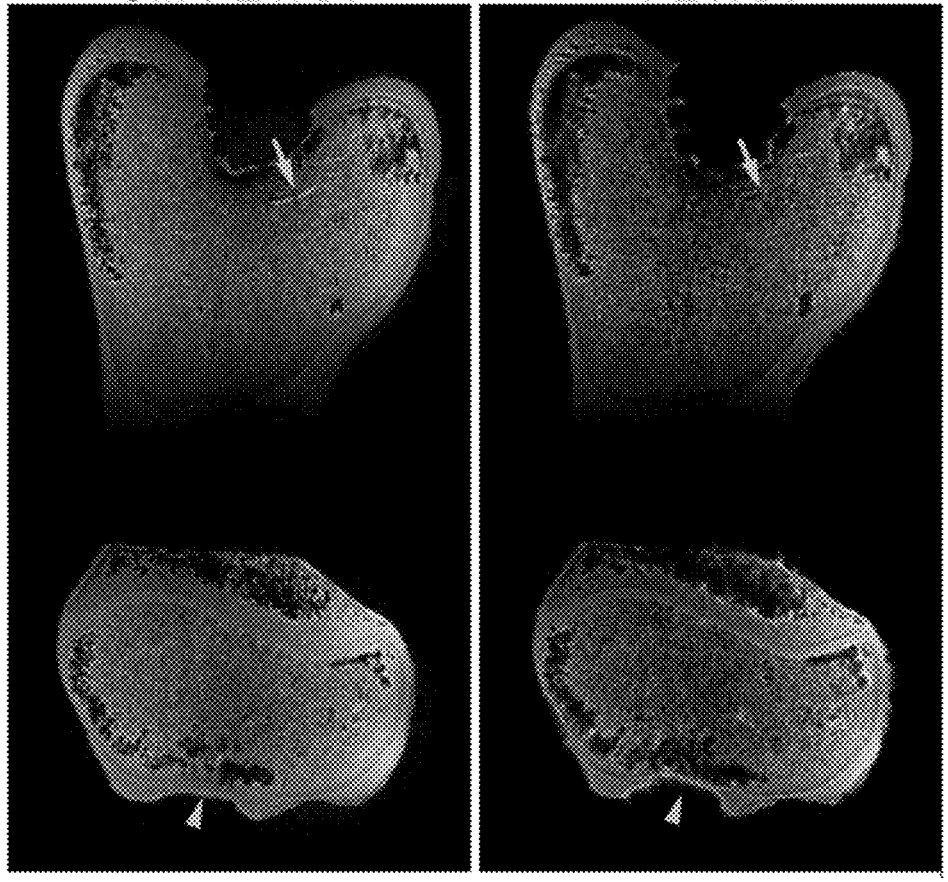
FIG. 4 illustrates 3D ex vivo equine knee images acquired with GM-PETRA (200 kHz, left) and PETRA (60 kHz, right). The images from GM-PETRA are sharper overall compared to those from PETRA, especially around tissue-air interfaces (arrow head). Small vessels are more clearly seen in the GM-PETRA images (arrow) than the PETRA images.

In both the conventional PETRA and GM-PETRA acquisitions, the outer region of k-space is sampled along a number of radial half-projections, whereas the center region of k-space is sampled using a SPI scheme that is based on Cartesian sampling. An example of such a k-space sampling pattern is shown in FIG. 3. The outer region of k-space can also be sampled along other non-radial trajectories, such as along spiral cones. During image reconstruction, both of these datasets are combined. Because the center of k-space, $k_0$, is located at the center of the hard pulse 102 in both conventional PETRA and GM-PETRA imaging schemes, the center points of k-space are not sampled during the time period, $t_k$, following the hard pulse 102 and before the acquisition window 106. This time period, $t_k$, can be defined as, $$t_k = \frac{pw}{2} + t_s; \qquad (3)$$

where pw is the pulse width of the excitation pulse 102 and $t_s$ is the T/R switching delay time mentioned above.

For the SPI acquisitions of the GM-PETRA imaging scheme, the missing central portion of k-space can be sampled during a first time period during which the gradient amplitude remains constant, thereby acquiring first data. As one example, this first time period can be the delay time, $t_d$. These missing k-space points satisfy the following relationship:

$$|k| < \gamma G_{ex} \cdot t_k = k_{SPI} \qquad (4);$$

where $\gamma$ is the gyromagnetic ratio and $G_{ex}$ is the gradient amplitude of the constant gradient applied during the delay time, $t_d$. The outer portions of k-space are then sampled during a second time period following the RF excitation and during which the gradient amplitude is being modulated, such as while the gradient amplitude is increasing, thereby acquiring second data. In some examples, the second data are acquired using a radial acquisition. Non-radial acquisitions can also be used to acquire the second data. As one example, the second data can also be acquired using a spiral cone acquisition.

The GM-PETRA techniques described here allow for the increase of readout bandwidth while reducing image blurring artifacts due to off-resonance and T2* signal decay. Particularly, the GM-PETRA techniques described here enable flexible settings of excitation and readout bandwidths; thus, the excitation bandwidth can be independently decreased to alleviate the severe limitations imposed by SAR and RF peak power in clinical ZTE applications while keeping readout bandwidth high.

In ZTE, as the excitation bandwidth increases, achievable flip angles are severely limited by the short pulse width, as mentioned above. When a longer pulse is used, the sinc-shaped excitation profile of the hard pulse causes blurring artifacts around the edges of the field-of-view. By combining the gradient modulation described here with frequency-modulated pulse excitation, the limitation on flip angle can be further alleviated.

Example: Ex Vivo Equine Knee Imaging

In an example study, ex vivo equine knee imaging was performed in a Siemens 7T MRI scanner. GM-PETRA was compared with conventional PETRA. The minimum T/R switching delay, $t_s$, was 20 µs under the standard Siemens setting. The extra delay time, $t_d$, before modulating the gradient amplitude in GM-PETRA was set to 20 µs. Sequence parameters in GM-PETRA were as follows: pw=20 µs (bandwidth ~60 kHz); TE~45 µs; TR=4 ms; flip angle=3 degrees; FOV=16×16×16 cm³; total acquisitions=131,072; including 123 SPI acquisitions; and scan time=8 min 44 sec. The same parameters were used for PETRA except for the TR was instead set to 4.2 ms (scan time=9 min 10 sec). Gradient modulation was applied in GM-PETRA using a linear rise up from γG·FOV=60 kHz to 200 kHz, and the gradient rise time was 210 µs. In PETRA, the gradients were kept constant (60 kHz). The time used for extra SPI acquisitions (123 TRs) was about 0.5 sec for both PETRA and GM-PETRA. Image reconstruction was performed offline with a home-built C program. The image matrix was 400×400×400 with 0.4 mm isotropic nominal resolution.

Equine knee images with GM-PETRA and conventional PETRA are shown in FIG. 2. The sharpness of the images was visually improved for GM-PETRA, especially around the regions with strong magnetic susceptibility differences, such as air tissue interfaces. Moreover, GM-PETRA more clearly visualized fine structures such as small vessels, whereas these features were blurry in the PETRA images.

GM-PETRA showed significantly less off-resonance blurring compared to the conventional PETRA technique under the same excitation bandwidth condition. Gradient modulation can therefore improve the PETRA image quality without any special hardware modification in clinical scanners. GM-PETRA can thus be used to remove off-resonance blurring by increasing the gradient amplitude after excitation with lower bandwidth. The independence of the excitation and readout bandwidth settings is another advantage of using gradient modulation in PETRA. In general, PETRA with higher excitation bandwidth has a severe limitation on available flip angles due to its high RF peak power and SAR. The flexibility on excitation and readout bandwidth settings in GM-PETRA, however, can significantly mitigate this flip angle limitation.

Figure 5:
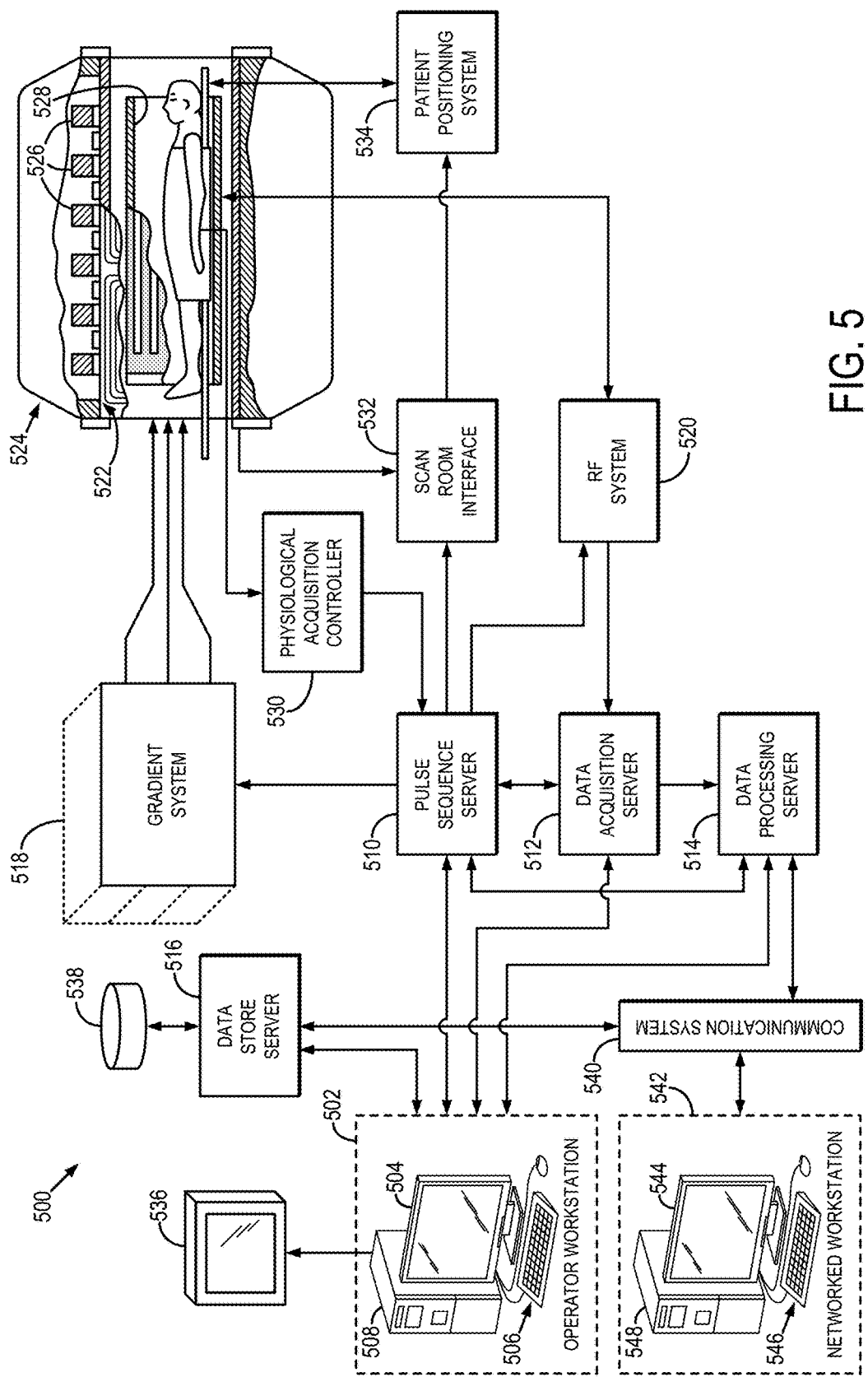
FIG. 5 is a block diagram of an example of a magnetic resonance imaging ("MRI") system.

Referring particularly now to FIG. 5, an example of a magnetic resonance imaging ("MRI") system 500 that can implement the methods described here is illustrated. The MRI system 500 includes an operator workstation 502 that may include a display 504, one or more input devices 506 (e.g., a keyboard, a mouse), and a processor 508. The processor 508 may include a commercially available programmable machine running a commercially available operating system. The operator workstation 502 provides an operator interface that facilitates entering scan parameters into the MRI system 500. The operator workstation 502 may be coupled to different servers, including, for example, a pulse sequence server 510, a data acquisition server 512, a data processing server 514, and a data store server 516. The operator workstation 502 and the servers 510, 512, 514, and 516 may be connected via a communication system 540, which may include wired or wireless network connections.

The pulse sequence server 510 functions in response to instructions provided by the operator workstation 502 to operate a gradient system 518 and a radiofrequency ("RF") system 520. Gradient waveforms for performing a prescribed scan are produced and applied to the gradient system 518, which then excites gradient coils in an assembly 522 to produce the magnetic field gradients $G_x$, $G_y$, and $G_z$ that are used for spatially encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil to perform the prescribed magnetic resonance pulse sequence. Responsive magnetic resonance signals detected by the RF coil 528, or a separate local coil, are received by the RF system 520. The responsive magnetic resonance signals may be amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the prescribed scan and direction from the pulse sequence server 510 to produce RF pulses of the desired frequency, phase, and pulse amplitude waveform. The generated RF pulses may be applied to the whole-body RF coil 528 or to one or more local coils or coil arrays.

The RF system 520 also includes one or more RF receiver channels. An RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (5);$$

and the phase of the received magnetic resonance signal may also be determined according to the following relationship:

$$\varphi = \tan^{-1}\left(\frac{Q}{I}\right). \qquad (6)$$

The pulse sequence server 510 may receive patient data from a physiological acquisition controller 530. By way of example, the physiological acquisition controller 530 may receive signals from a number of different sensors connected to the patient, including electrocardiograph ("ECG") signals from electrodes, or respiratory signals from a respiratory bellows or other respiratory monitoring devices. These signals may be used by the pulse sequence server 510 to synchronize, or "gate," the performance of the scan with the subject's heart beat or respiration.

The pulse sequence server 510 may also connect to a scan room interface circuit 532 that receives signals from various sensors associated with the condition of the patient and the magnet system. Through the scan room interface circuit 532, a patient positioning system 534 can receive commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, so that data is not lost by data overrun. In some scans, the data acquisition server 512 passes the acquired magnetic resonance data to the data processor server 514. In scans that require information derived from acquired magnetic resonance data to control the further performance of the scan, the data acquisition server 512 may be programmed to produce such information and convey it to the pulse sequence server 510. For example, during pre-scans, magnetic resonance data may be acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also process magnetic resonance signals used to detect the arrival of a contrast agent in a magnetic resonance angiography ("MRA") scan. For example, the data acquisition server 512 may acquire magnetic resonance data and processes it in real-time to produce information that is used to control the scan.

The data processing server 514 receives magnetic resonance data from the data acquisition server 512 and processes the magnetic resonance data in accordance with instructions provided by the operator workstation 502. Such processing may include, for example, reconstructing twodimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 514 are conveyed back to the operator workstation 502 for storage. Real-time images may be stored in a data base memory cache, from which they may be output to operator display 502 or a display 536. Batch mode images or selected real time images may be stored in a host database on disc storage 538. When such images have been reconstructed and transferred to storage, the data processing server 514 may notify the data store server 516 on the operator workstation 502. The operator workstation 502 may be used by an operator to archive the images, produce films, or send the images via a network to other facilities.

The MRI system 500 may also include one or more networked workstations 542. For example, a networked workstation 542 may include a display 544, one or more input devices 546 (e.g., a keyboard, a mouse), and a processor 548. The networked workstation 542 may be located within the same facility as the operator workstation 502, or in a different facility, such as a different healthcare institution or clinic.

The networked workstation 542 may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image with a magnetic resonance imaging (MRI) system, the steps of the method comprising:
   (a) applying a radio frequency (RF) excitation pulse to a subject;
   (b) acquiring first data from the subject using the MRI system to sample a central region of k-space during a first time period occurring after the RF excitation pulse, wherein a constant magnetic field gradient is applied to the subject during the first time period while the first data are acquired;
   (c) acquiring second data from the subject using the MRI system to sample an outer region of k-space during a second time period occurring after the RF excitation pulse, wherein an amplitude-modulated magnetic field gradient is applied to the subject during the second time period while the second data are acquired; and
   (d) reconstructing an image of the subject from the first data and the second data.

2. The method as recited in claim 1, wherein the first data are acquired by sampling the central region of k-space using a single point imaging (SPI) acquisition.

3. The method as recited in claim 1, wherein the second data are acquired by sampling the outer region of k-space using a radial acquisition.

4. The method as recited in claim 1, wherein the second data are acquired by sampling the outer region of k-space using a spiral cone acquisition.

5. The method as recited in claim 1, wherein the RF excitation pulse is applied with an excitation bandwidth that is different from a readout bandwidth associated with the amplitude-modulated magnetic field gradient applied while the second data are acquired.

6. The method as recited in claim 5, wherein the excitation bandwidth is lower than the readout bandwidth.

7. The method as recited in claim 1, wherein the first period of time is associated with a delay time having a beginning that coincides with when a receiver gate in the MRI system opens to begin data acquisition.

8. The method as recited in claim 7, wherein the delay time begins after a transmit/receive switching time of the MRI system.

9. The method as recited in claim 1, wherein applying the amplitude-modulated magnetic field gradient includes increasing a magnetic field gradient from a first value to a second value.

10. The method as recited in claim 9, wherein the first value is an amplitude of the constant magnetic field gradient.

11. The method as recited in claim 10, wherein the central portion of k-space is defined based on the amplitude of the constant magnetic field gradient and a time from a center of the RF excitation pulse to when a receiver gate of the MRI system opens.

12. The method as recited in claim 11, wherein the central portion of k-space is defined as points in k-space less than $\gamma G_{ex} \cdot t_k$, wherein $\gamma$ is a gyromagnetic ratio, $G_{ex}$ is the amplitude of the constant magnetic field gradient, and $t_k$ is the time from a center of the RF excitation pulse to when a receiver gate of the MRI system opens.

13. A magnetic resonance imaging (MRI) system, comprising:
   a magnet for generating a polarizing magnetic field, $B_0$, in which a subject to be imaged is positioned;
   a radio frequency (RF) coil;
   a gradient coil assembly comprising at least one gradient coil;
   a processor in communication with the RF coil and the gradient coil assembly; and
   wherein under instructions received from the processor the RF coil, and the gradient coil assembly operate to perform a pulse sequence that includes:
     (a) applying an RF excitation pulse using the RF coil;
     (b) acquiring first data using the RF coil to sample a central region of k-space during a first time period occurring after the RF excitation pulse, wherein a constant magnetic field gradient is applied by the gradient coil assembly during the first time period while the first data are acquired;
     (c) acquiring second data using the RF coil to sample an outer region of k-space during a second time period occurring after the RF excitation pulse, wherein an amplitude-modulated magnetic field gradient is applied by the gradient coil assembly during the second time period while the second data are acquired.

14. The MRI system as recited in claim 13, wherein the processor is configured to operate the RF coil and the gradient coil assembly to acquire the first data using a single point imaging (SPI) acquisition.

15. The MRI system as recited in claim 13, wherein the processor is configured to operate the RF coil and the gradient coil assembly to acquire the second data using a radial acquisition.

16. The MRI system as recited in claim 13, wherein the processor sets an excitation bandwidth that is different from a readout bandwidth.

17. The MRI system as recited in claim 16, wherein the processor sets the excitation bandwidth as lower than the readout bandwidth.

18. The MRI system as recited in claim 13, further comprising a receiver gate in communication with the RF coil, and wherein the first period of time is associated with a delay time having a beginning that coincides with when the receiver gate opens to begin data acquisition of the first data.

19. The MRI system as recited in claim 13, wherein the processor operates the gradient coil assembly to apply the amplitude-modulated magnetic field gradient by increasing a magnetic field gradient from a first value to a second value.

20. The MRI system as recited in claim 19, wherein the first value is an amplitude of the constant magnetic field gradient.

\* \* \* \* \*